United States Patent
Fukushima

(10) Patent No.: US 12,015,349 B2
(45) Date of Patent: Jun. 18, 2024

(54) SWITCHING CIRCUIT, DC/DC CONVERTER, AND CONTROL CIRCUIT THEREOF

(71) Applicant: ROHM Co., LTD., Kyoto (JP)

(72) Inventor: Shun Fukushima, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 0 days.

(21) Appl. No.: 18/047,730

(22) Filed: Oct. 19, 2022

(65) Prior Publication Data
US 2023/0129526 A1    Apr. 27, 2023

(30) Foreign Application Priority Data

Oct. 21, 2021 (JP) ................................. 2021-172400

(51) Int. Cl.
| | |
|---|---|
| *H03K 19/003* | (2006.01) |
| *H02M 3/158* | (2006.01) |
| *H03K 17/687* | (2006.01) |
| *H03K 19/0175* | (2006.01) |

(52) U.S. Cl.
CPC ...... *H02M 3/1584* (2013.01); *H03K 17/6871* (2013.01); *H03K 19/00361* (2013.01); *H03K 19/0175* (2013.01)

(58) Field of Classification Search
CPC .... H03K 17/06; H03K 17/063; H03K 17/687; H03K 17/6871; H03K 17/6872; H03K 17/6874; H03K 19/0013; H03K 19/003; H03K 19/00346; H03K 19/00361; H03K 19/0175; H03K 19/017509; H03K 19/0185; H03K 19/018507; H03K 2217/0081; H03K 3/1584; H02M 1/08; H02M 3/158

See application file for complete search history.

(56) References Cited

U.S. PATENT DOCUMENTS

| | | | | |
|---|---|---|---|---|
| 10,673,426 | B2 * | 6/2020 | Ming | H03K 17/102 |
| 2020/0036372 | A1 * | 1/2020 | Shankar | H02M 1/08 |
| 2023/0130933 | A1 * | 4/2023 | Fukushima | H02M 3/156 |
| | | | | 323/205 |

FOREIGN PATENT DOCUMENTS

JP       2020078203       5/2020

* cited by examiner

*Primary Examiner* — Long Nguyen
(74) *Attorney, Agent, or Firm* — CHIP LAW GROUP

(57) ABSTRACT

Disclosed is a switching circuit including an input terminal, a switching terminal, a grounding terminal, a bootstrap terminal, a high-side transistor connected between the input terminal and the switching terminal, a low-side transistor connected between the switching terminal and the grounding terminal, a bootstrap capacitor connected between the switching terminal and the bootstrap terminal, a bootstrap switch connected between a constant voltage line and the bootstrap terminal, and a driver circuit configured to turn on the bootstrap switch in a period of time in which the low-side transistor is on and to turn off the bootstrap switch in a period of time in which the low-side transistor is off. The bootstrap switch includes two P-channel metal oxide semiconductor transistors connected in anti-series with each other between the constant voltage line and the bootstrap terminal.

8 Claims, 11 Drawing Sheets

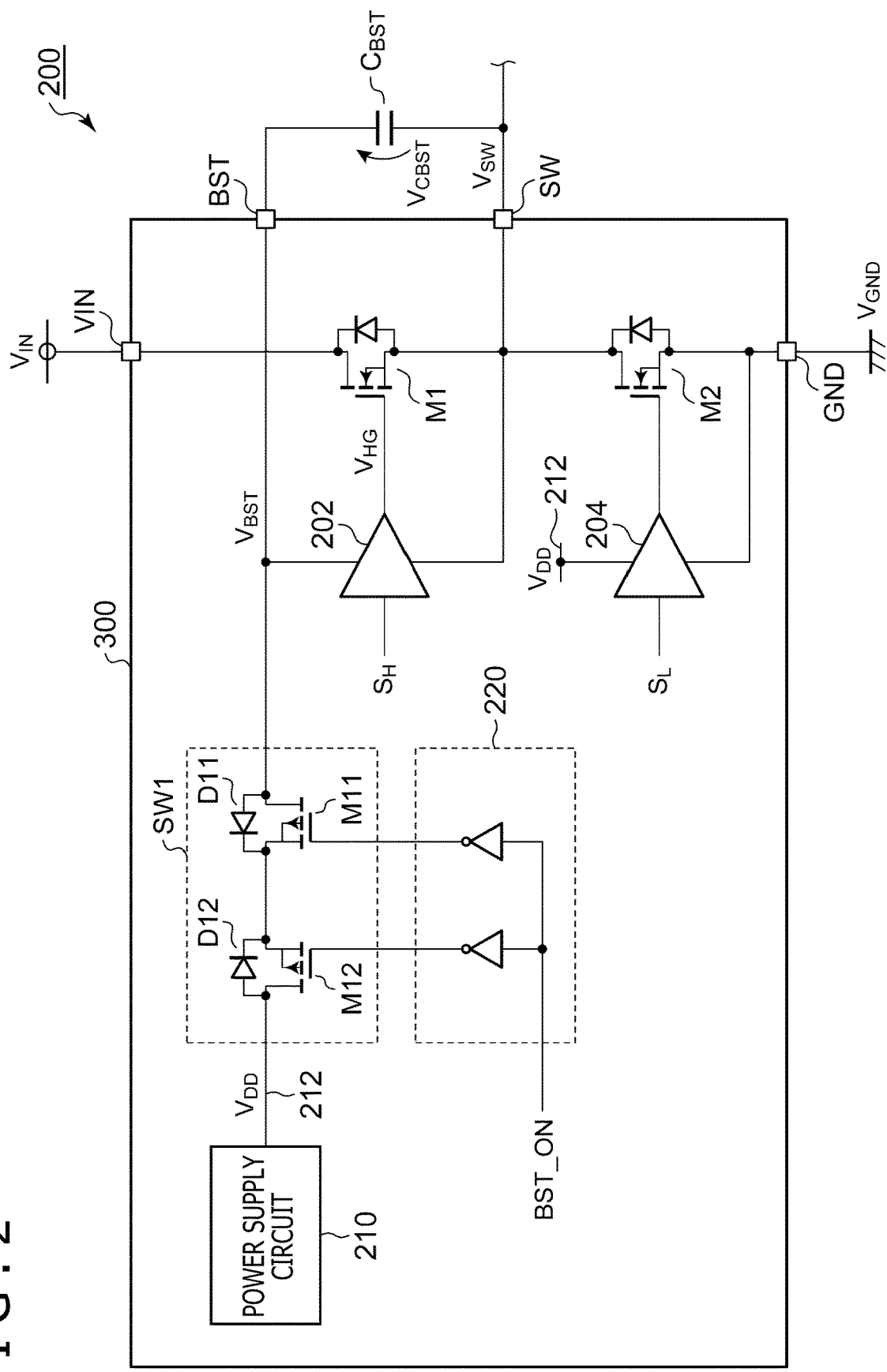
F I G . 2

SWITCHING CIRCUIT, DC/DC CONVERTER, AND CONTROL CIRCUIT THEREOF

CROSS REFERENCE TO RELATED APPLICATIONS

This application claims priority benefit of Japanese Patent Application No. JP 2021-172400 filed in the Japan Patent Office on Oct. 21, 2021. Each of the above-referenced applications is hereby incorporated herein by reference in its entirety.

BACKGROUND

The present disclosure relates to a switching circuit.

A switching circuit is used in a direct current to direct current (DC/DC) converter or an inverter, for example. FIG. 1 is a circuit diagram of a switching circuit. A switching circuit 100R includes a high-side transistor M1 disposed between an input (VIN) terminal and a switching (SW) terminal and a low-side transistor M2 disposed between the SW terminal and a grounding (GND) terminal. In a state in which the high-side transistor M1 is on and the low-side transistor M2 is off, the SW terminal is at a high level (a voltage $V_{IN}$ of the VIN terminal occurs). In a state in which the high-side transistor M1 is off and the low-side transistor M2 is on, the SW terminal is at a low level (a voltage $V_{GND}$ of the GND terminal occurs). Incidentally, a rectifying element such as a Schottky diode may be used in place of the low-side transistor M2.

An N-channel (or an NPN-type) transistor may be used as the high-side transistor M1. In this case, in order to turn on the high-side transistor M1, a gate voltage $V_{HG}$ higher than the input voltage $V_{IN}$ needs to be applied to a gate of the high-side transistor M1. A bootstrap circuit is used to generate the gate voltage $V_{HG}$ higher than the input voltage $V_{IN}$.

A bootstrap capacitor $C_{BST}$ is connected between a bootstrap (BST) terminal and the SW terminal. A power supply circuit 110 for the bootstrap circuit generates a constant voltage $V_{DD}$. The constant voltage $V_{DD}$ is set higher than a gate-to-source threshold voltage $V_{GS(th)}$ of the high-side transistor M1. The constant voltage $V_{DD}$ is applied to the bootstrap capacitor $C_{BST}$ via a diode D1 and the BST terminal.

In a state in which the SW terminal is low (0 V), the bootstrap capacitor $C_{BST}$ is charged with $\Delta V = V_{DD} - Vf$, where Vf is a forward voltage of the diode D1. A voltage $V_{BST}$ of the BST terminal is $V_{SW} + \Delta V$. The voltage $V_{BST}$ of the BST terminal is supplied to an upper-side power supply terminal of a high-side driver 102. A lower-side power supply terminal of the high-side driver 102 is connected to the SW terminal. The high-side driver 102 outputs the voltage $V_{BST}$ when a control signal $S_H$ is at an on-level (for example, high). The high-side driver 102 outputs the voltage $V_{SW}$ when the control signal $S_H$ is at an off-level (for example, low).

An example of the related art is disclosed in Japanese Patent Laid-Open No. 2020-78203.

SUMMARY

In controlling the switching circuit, a dead time during which both the high-side transistor M1 and the low-side transistor M2 are in an off-state is provided. During the dead time, the voltage $V_{SW}$ of the SW terminal is a negative voltage ($-V_{NEG}$). The diode D1 allows a current to flow therethrough even during the dead time. Thus, the BST terminal is charged to the constant voltage $V_{DD}$. As a result, in the dead time, a voltage across the bootstrap capacitor $C_{BST}$ is increased to $V_{DD} + V_{NEG}$. Hence, as the switching voltage $V_{SW}$ varies greatly to a negative voltage side in the dead time, the bootstrap capacitor $C_{BST}$ is overcharged.

A similar problem also arises in a configuration using a bootstrap switch in place of the diode D1. Specifically, the bootstrap switch includes a metal oxide semiconductor (MOS) switch having a body diode, and even when the MOS switch is turned off during the dead time, the body diode behaves in a similar manner to the diode D1 in FIG. 1, so that the bootstrap capacitor $C_{BST}$ is overcharged.

The present disclosure has been made in such circumstances. It is desirable to provide a switching circuit that suppresses the overcharging of a bootstrap capacitor.

A switching circuit according to an embodiment of the present disclosure includes an input terminal, a switching terminal, a grounding terminal, a bootstrap terminal, a high-side transistor connected between the input terminal and the switching terminal, a low-side transistor connected between the switching terminal and the grounding terminal, a bootstrap capacitor connected between the switching terminal and the bootstrap terminal, a bootstrap switch connected between a constant voltage line and the bootstrap terminal, and a driver circuit configured to turn on the bootstrap switch in a period of time in which the low-side transistor is on and to turn off the bootstrap switch in a period of time in which the low-side transistor is off. The bootstrap switch includes two P-channel MOS (PMOS) transistors connected in anti-series with each other between the constant voltage line and the bootstrap terminal.

It is to be noted that any combination of the above constituent elements as well as constituent elements and expressions obtained by replacing constituent elements and expressions between a method, a device, and a system are also effective as embodiments of the present disclosure.

According to the embodiment of the present disclosure, the overcharging of a bootstrap capacitor can be suppressed.

BRIEF DESCRIPTION OF THE DRAWINGS

FIG. 2 is a circuit diagram of a switching circuit according to a first embodiment;

DETAILED DESCRIPTION OF THE PREFERRED EMBODIMENTS

Outline of Embodiments

Figure 1:
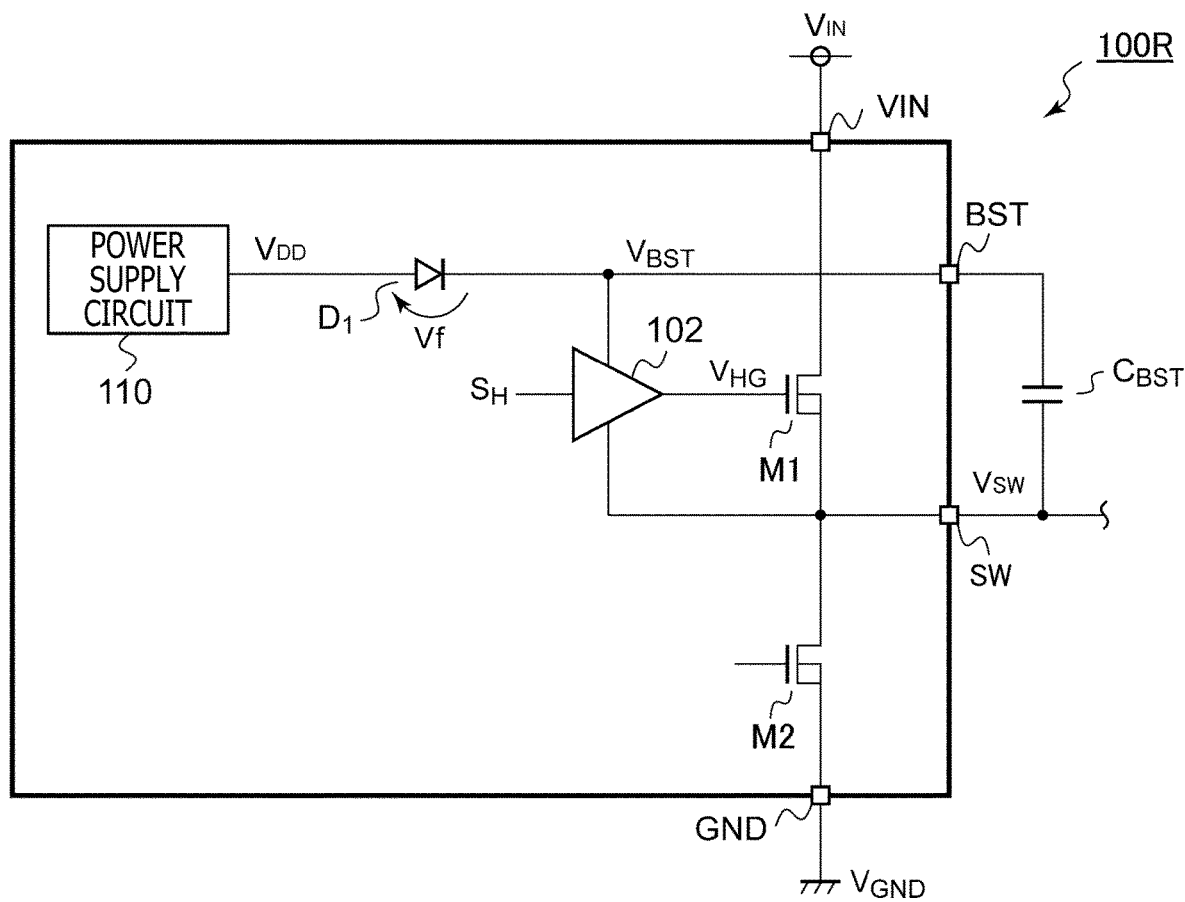
FIG. 1 is a circuit diagram of a switching circuit.

An outline of some illustrative embodiments of the present disclosure will be given. In this outline, to facilitate the basic understanding of embodiments of the present disclosure, some concepts of one or a plurality of embodiments are described in a simplified manner as an introduction to the following detailed description, and do not limit the scope of the technology or the disclosure. This outline is not a comprehensive outline of all conceivable embodiments, and is not intended to identify important elements of all of the embodiments or define the scope of a part or all of embodiments. For convenience, "one embodiment" may be used to refer to one embodiment (an example or a modification) or a plurality of embodiments (examples or modifications) disclosed in the present specification.

A switching circuit according to one embodiment includes an input terminal, a switching terminal, a grounding terminal, a bootstrap terminal, a high-side transistor connected between the input terminal and the switching terminal, a low-side transistor connected between the switching terminal and the grounding terminal, a bootstrap capacitor connected between the switching terminal and the bootstrap terminal, a bootstrap switch connected between a constant voltage line and the bootstrap terminal, and a driver circuit configured to turn on the bootstrap switch in a period of time in which the low-side transistor is on and to turn off the bootstrap switch in a period of time in which the low-side transistor is off. The bootstrap switch includes two PMOS transistors connected in anti-series with each other between the constant voltage line and the bootstrap terminal.

According to this configuration, during a dead time, a current path from the constant voltage line to the bootstrap terminal is interrupted, so that the bootstrap capacitor can be prevented from being overcharged.

In the one embodiment, respective sources of the two PMOS transistors may be connected to each other.

In the one embodiment, the driver circuit may include a level shifter configured to level-shift a control signal that gives an instruction for turning on or off the bootstrap switch, a first inverter configured to drive one of the two PMOS transistors according to output of the level shifter, and a second inverter configured to drive the other of the two PMOS transistors according to the output of the level shifter. The level shifter may level-shift a high level of the control signal to a voltage of the sources of the two PMOS transistors, and level-shift a low level of the control signal to a voltage of the switching terminal. Respective upper-side power supply terminals of the first inverter and the second inverter may be connected to the sources of the two PMOS transistors, and respective lower-side power supply terminals of the first inverter and the second inverter may be connected to the switching terminal.

In the one embodiment, respective drains of the two PMOS transistors may be connected to each other. In this configuration, it is sufficient if only one of the two PMOS transistors that is on the bootstrap terminal side includes a high withstand voltage element. Hence, a circuit area can be reduced.

In the one embodiment, the driver circuit may include a level shifter configured to level-shift a control signal that gives an instruction for turning on or off the bootstrap switch, a first inverter configured to drive a first transistor of the two PMOS transistors that is on the bootstrap terminal side, according to output of the level shifter, and a second inverter configured to drive a second transistor of the two PMOS transistors that is on the constant voltage line side, according to the control signal. The level shifter may level-shift a high level of the control signal to a voltage of the bootstrap terminal, and level-shift a low level of the control signal to a voltage of the switching terminal. An upper-side power supply terminal of the first inverter may be connected to the bootstrap terminal, and a lower-side power supply terminal of the first inverter may be connected to the switching terminal. An upper-side power supply terminal of the second inverter may be connected to the constant voltage line, and a lower-side power supply terminal of the second inverter may be grounded.

In the one embodiment, the switching circuit may integrally be mounted on one semiconductor substrate. Here, a case of being "integrally mounted" includes a case where all of circuit constituent elements are formed on the semiconductor substrate and a case where main circuit constituent elements are integrally mounted. Some of resistances, capacitors, and other constituent elements may be disposed on the outside of the semiconductor substrate to adjust circuit constants. Integrating the circuit on one chip can reduce a circuit area and keep characteristics of the circuit elements uniform.

A control circuit of a DC/DC converter according to the one embodiment may include any of the above-described switching circuits and a feedback controller configured to perform feedback control on the switching circuit such that a state of the DC/DC converter approaches a target state.

Embodiments

Preferred embodiments will hereinafter be described with reference to the drawings. Identical or equivalent constituent elements, members, and processing illustrated in the drawings are denoted by the same reference signs, and redundant description thereof will be omitted as appropriate. In addition, the embodiments are illustrative and do not limit the technology. All features described in the embodiments and combinations thereof are not necessarily essential to the technology.

In the present specification, a "state in which a member A is connected to a member B" includes not only a state in which the member A and the member B are physically directly connected to each other, but also a state in which the member A and the member B are indirectly connected to each other via another member that does not substantially affect an electrically connected state of these members or that does not impair functions or effects produced by the coupling of these members.

Similarly, a "state in which a member C is disposed between the member A and the member B" includes not only a state in which the member A and the member C or the member B and the member C are directly connected to each other, but also a state in which the member A and the member C or the member B and the member C are indirectly connected to each other via another member that does not substantially affect an electrically connected state of these members or that does not impair functions or effects produced by the coupling of these members.

In addition, a "signal A (voltage or current) corresponds to a signal B (voltage or current)" means that the signal A has a correlation with the signal B, and specifically includes the following cases: (i) a case where the signal A is the signal B; (ii) a case where the signal A is in proportion to the signal B; (iii) a case where the signal A is obtained by level-shifting the signal B; (iv) a case where the signal A is obtained by amplifying the signal B; (v) a case where the signal A is obtained by inverting the signal B; and (vi) any combination of the above-described cases, for example. It is to be understood by those skilled in the art that the "correspondence" between the signals A and B is determined according to the kinds and applications of the signals A and B.

FIG. 2 is a circuit diagram of a switching circuit 200 according to a first embodiment. The switching circuit 200 includes a high-side transistor M1, a low-side transistor M2, a high-side driver 202, a low-side driver 204, a bootstrap capacitor $C_{BST}$, a bootstrap switch SW1, and a power supply circuit 210.

The bootstrap capacitor $C_{BST}$ is attached externally, and the other parts of the switching circuit 200 are integrated on a control circuit 300 as an integrated circuit. Incidentally, discrete elements may be employed as the high-side transistor M1 and the low-side transistor M2 and may externally be attached to the control circuit 300.

An external direct-current voltage (input voltage) $V_{IN}$ is supplied to an input (VIN) terminal. A grounding (GND) terminal is grounded. An unillustrated load, inductor, or transformer is connected to a switching (SW) terminal. The switching circuit 200 generates, at the SW terminal, a switching signal $V_{SW}$ that makes transitions between a high ($V_{IN}$) and a low ($V_{GND}$).

The bootstrap capacitor $C_{BST}$ is externally attached between a bootstrap (BST) terminal and the SW terminal. The high-side transistor M1 is disposed between the VIN terminal and the SW terminal. The low-side transistor M2 is disposed between the SW terminal and the GND terminal.

In the present embodiment, the high-side transistor M1 and the low-side transistor M2 are a metal oxide semiconductor field effect transistor (MOSFET). However, the transistors are not limited to this type. An insulated gate bipolar transistor (IGBT) or a bipolar transistor can also be used as the high-side transistor M1 and the low-side transistor M2. The high-side driver 202 drives the high-side transistor M1 on the basis of a high-side pulse $S_H$. An upper-side power supply terminal of the high-side driver 202 is connected to the BST terminal and receives a voltage $V_{BST}$. A lower-side power supply terminal of the high-side driver 202 is connected to the SW terminal and receives a switching voltage $V_{SW}$. The low-side driver 204 drives the low-side transistor M2 on the basis of a low-side pulse $S_L$.

The power supply circuit 210 generates a power supply voltage $V_{DD}$ for bootstrapping and supplies the power supply voltage $V_{DD}$ to a constant voltage line 212. The configuration of the power supply circuit 210 is not limited to a particular configuration. The power supply circuit 210 may be a linear regulator, for example. The power supply voltage $V_{DD}$ may be generated in a power supply circuit provided outside of the control circuit 300.

The bootstrap switch SW1 is connected between the constant voltage line 212 and the BST terminal. A driver circuit 220 drives the bootstrap switch SW1 according to a control signal BST_ON. Specifically, the bootstrap switch SW1 is on during a period of time in which the low-side transistor M2 is on, that is, during a period of time in which the switching voltage $V_{SW}$ is low (0 V), and the bootstrap switch SW1 is off during a period of time in which the low-side transistor M2 is off, that is, during an interval that the switching voltage $V_{SW}$ is high ($V_{IN}$) or the SW terminal has high impedance. Hence, the logic level of the control signal BST_ON is the same as that of the control signal $S_L$ for the low-side transistor M2.

The bootstrap switch SW1 includes two PMOS transistors M11 and M12 connected in anti-series with each other between the constant voltage line 212 and the BST terminal. Each of the two PMOS transistors M11 and M12 has a back gate and a source connected to each other. The PMOS transistors M11 and M12 are connected to each other such that a cathode of a body diode D11 of the PMOS transistor M11 and a cathode of a body diode D12 of the PMOS transistor M12 face each other.

The driver circuit 220 drives the first PMOS transistor M11 and the second PMOS transistor M12, which are included in the bootstrap switch SW1, on the basis of the control signal BST_ON. Specifically, when the control signal BST_ON is high, the driver circuit 220 applies a low voltage to gates of the first PMOS transistor M11 and the second PMOS transistor M12 to turn these transistors on. Conversely, when the control signal BST_ON is low, the driver circuit 220 applies a high voltage to the gates of the first PMOS transistor M11 and the second PMOS transistor M12 to turn these transistors off.

The configuration of the switching circuit 200 has been described above.

A comparative technology will be described to clarify problems that can be solved by the switching circuit 200 according to the present embodiment.

Figure 3:
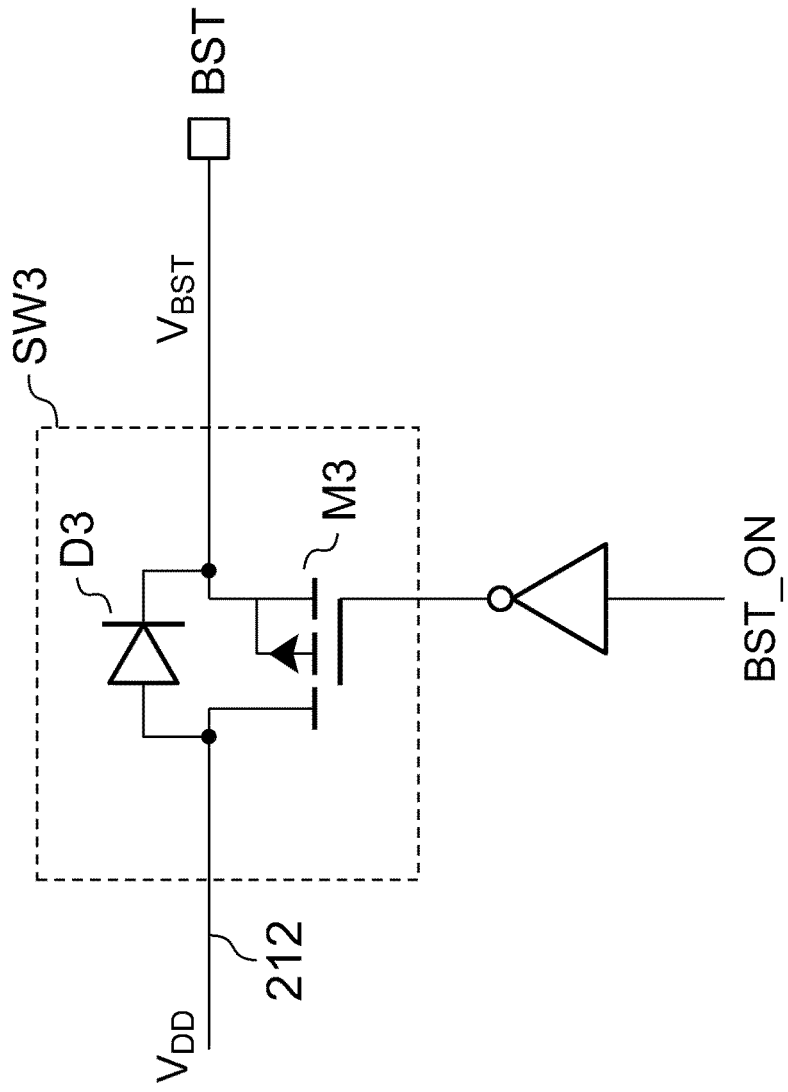
FIG. 3 is a diagram illustrating a part of a switching circuit according to a comparative technology.

FIG. 3 is a diagram illustrating a part of a switching circuit according to the comparative technology. In the comparative technology, a bootstrap switch SW3 includes one PMOS transistor M3. The other configuration is similar to that in FIG. 2. A drain of the PMOS transistor M3 is connected to the constant voltage line 212. A source of the PMOS transistor M3 is connected to the BST terminal. The PMOS transistor M3 performs a switching operation according to the control signal BST_ON. A back gate and the source of the PMOS transistor M3 are connected to each other. A body diode D3 is present between the back gate and the drain.

Figure 4:
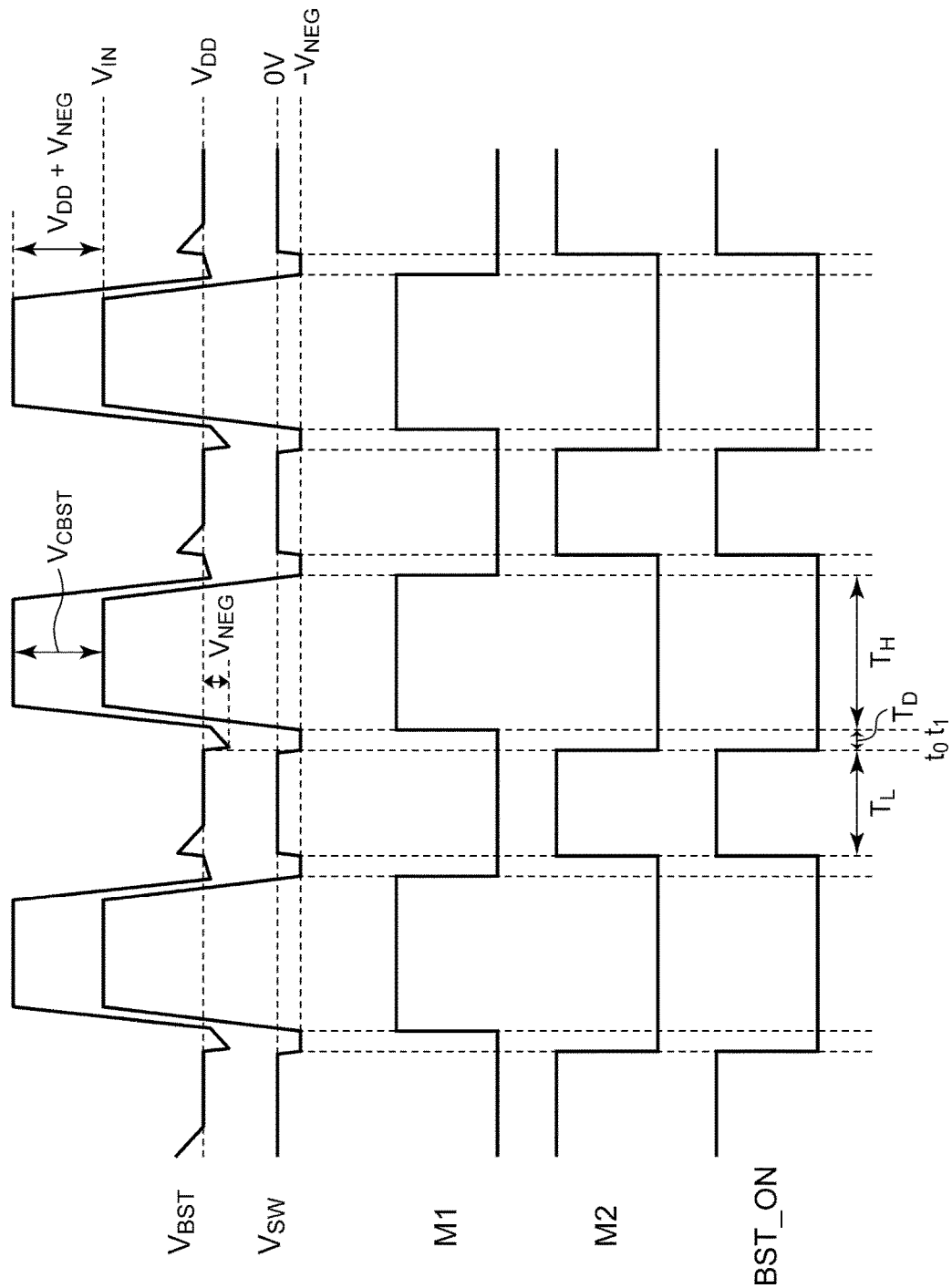
FIG. 4 is an operation waveform chart of the switching circuit including a bootstrap switch illustrated in FIG. 3.

FIG. 4 is an operation waveform chart of the switching circuit including the bootstrap switch illustrated in FIG. 3. A dead time TD is provided between a low interval $T_L$ during which the switching voltage $V_{SW}$ is low (0 V) and a high interval $T_H$ during which the switching voltage $V_{SW}$ is high ($V_{IN}$). In FIG. 4, waveforms indicated by M1 and M2 illustrate the on/off-states of the high-side transistor M1 and the low-side transistor M2 in a simple manner. There is an intermediate state between an on-state and an off-state in transistors. Hence, the edges of waveforms of M1 and M2 do not represent precise timings of turning on and turning off the transistors. The same is true for the high interval $T_H$ and the low interval $T_L$.

During the low interval $T_L$, the bootstrap switch SW3 is on, the voltage of the BST terminal is the power supply voltage $V_{DD}$, and the voltage $V_{SW}$ of the SW terminal is 0 V. Hence, during the low interval $T_L$, the bootstrap capacitor $C_{BST}$ is charged at the power supply voltage $V_{DD}$.

When the low-side transistor M2 is turned off at time $t_0$, a transition is made to a dead time $T_D$. As a result, the switching voltage $V_{SW}$ makes a transition from the input voltage $V_{IN}$ to a negative voltage $-V_{NEG}$. At this time, the charge of the bootstrap capacitor $C_{BST}$ is preserved, and therefore, the voltage $V_{BST}$ of the BST terminal decreases to approximately $V_{DD}-V_{NEG}$.

In the dead time Td, the bootstrap switch SW3 is off, but the body diode D3 of the bootstrap switch SW3 allows a current to flow therethrough, so that the voltage $V_{BST}$ of the BST terminal rises to the power supply voltage $V_{DD}$. As a result, at time $t_1$ which is an end of the dead time Td, a potential difference between the BST terminal and the SW terminal, that is, a voltage $V_{CBST}$ across the bootstrap capacitor $C_{BST}$, increases to $V_{DD}+V_{NEG}$.

When the high-side transistor M1 is turned on at time $t_1$, the switching voltage $V_{SW}$ rises to the input voltage $V_{IN}$. At this time, the voltage $V_{CBST}$ across the bootstrap capacitor $C_{BST}$ maintains the latest voltage level ($V_{DD}+V_{NEG}$), and therefore, the voltage $V_{BST}$ of the BST terminal rises to $V_{SW}+V_{CBST}=V_{IN}+(V_{DD}+V_{NEG})$.

That is, an increase in the negative voltage $-V_{NEG}$ in the dead time $T_D$ causes the overvoltage of the voltage $V_{BST}$ of the BST terminal. This is a first problem.

Figure 5:
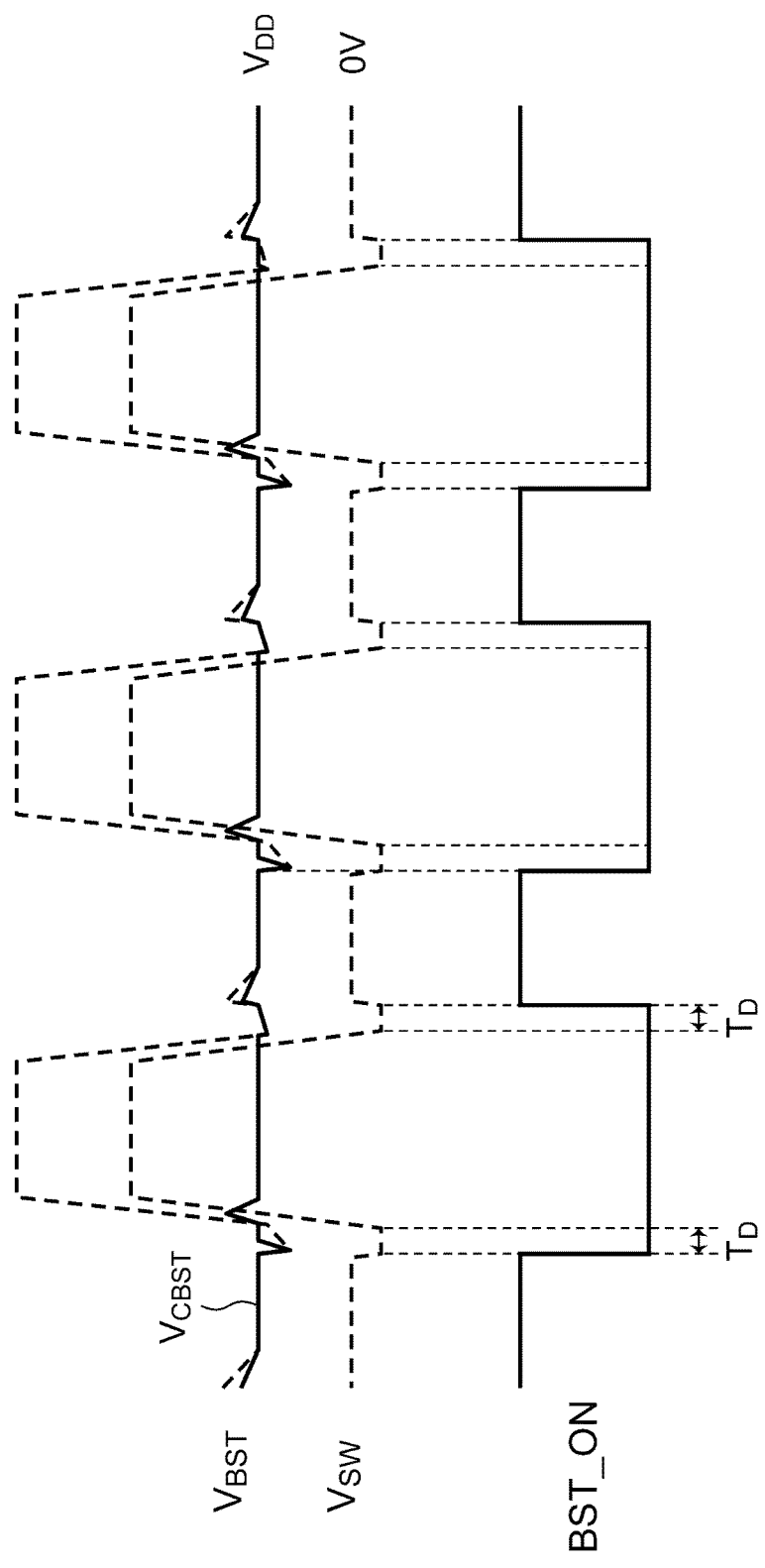
FIG. 5 is a waveform chart of the voltage of a bootstrap capacitor.

A second problem will next be described. FIG. 5 is a waveform chart of the voltage $V_{CBST}$ of the bootstrap capacitor $C_{BST}$. The voltage $V_{CBST}$ of the bootstrap capacitor $C_{BST}$ is $V_{CBST}=V_{BST}-V_{SW}$. It is desirable that the voltage $V_{CBST}$ be stabilized at the power supply voltage $V_{DD}$. However, in the comparative technology, the voltage $V_{CBST}$ varies at around the dead time $T_D$ in a positive direction and a negative direction with respect to the power supply voltage $V_{DD}$. This variation is a factor that causes an erroneous operation of an analog circuit, and can cause noise (electro magnetic interference (EMI)), which is not desirable. This is the second problem.

Figure 6:
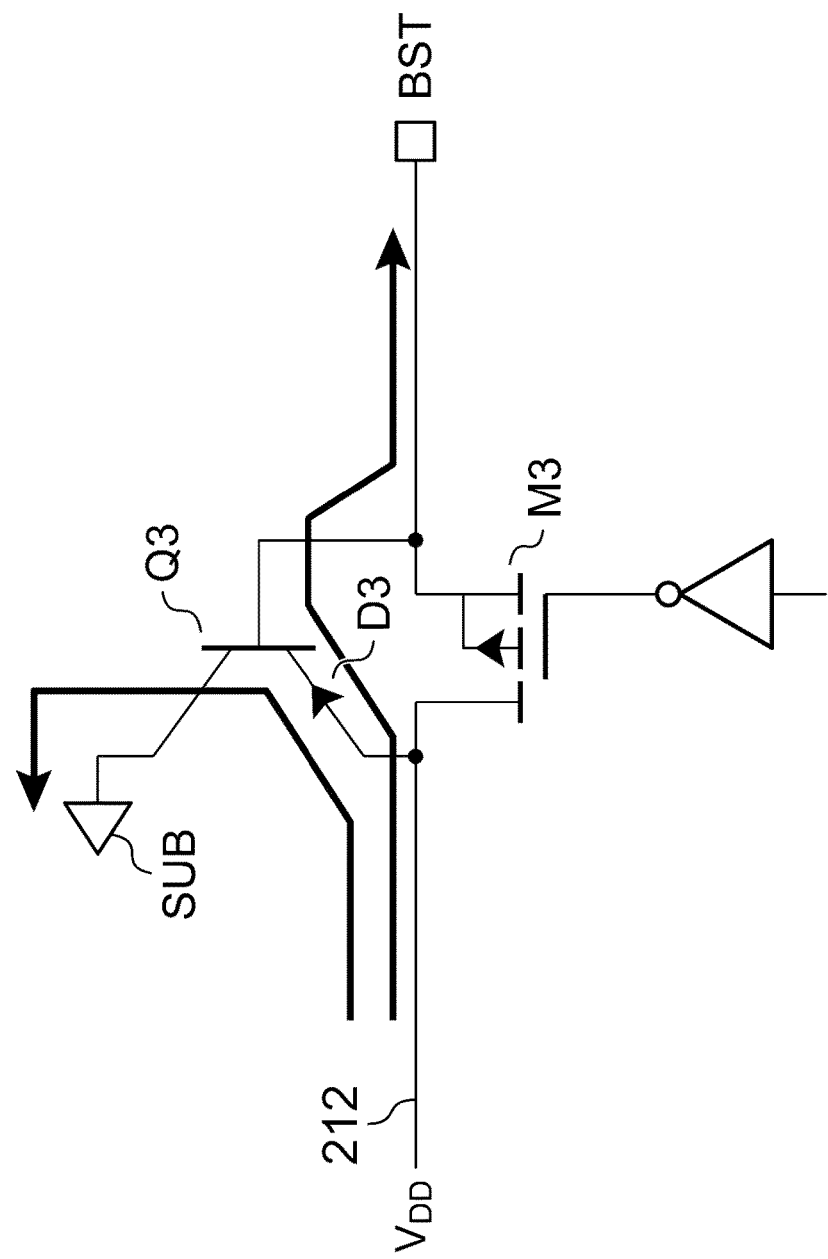
FIG. 6 is an equivalent circuit diagram of the bootstrap switch according to the comparative technology.

A third problem will next be described. FIG. 6 is an equivalent circuit diagram of the bootstrap switch SW3 according to the comparative technology. In a case where the bootstrap switch SW3 includes the PMOS transistor M3, a PNP bipolar transistor Q3 is present as a parasitic element. The above-described body diode D3 is a PN junction of the parasitic element Q3. As can be seen from FIG. 6, a part of a current flowing through the body diode D3 flows into the BST terminal, whereas the remaining part flows into a semiconductor substrate SUB via the parasitic element Q3. This causes variation in substrate potential. The variation in the substrate potential is a factor of an erroneous operation of the circuit.

Figure 7:
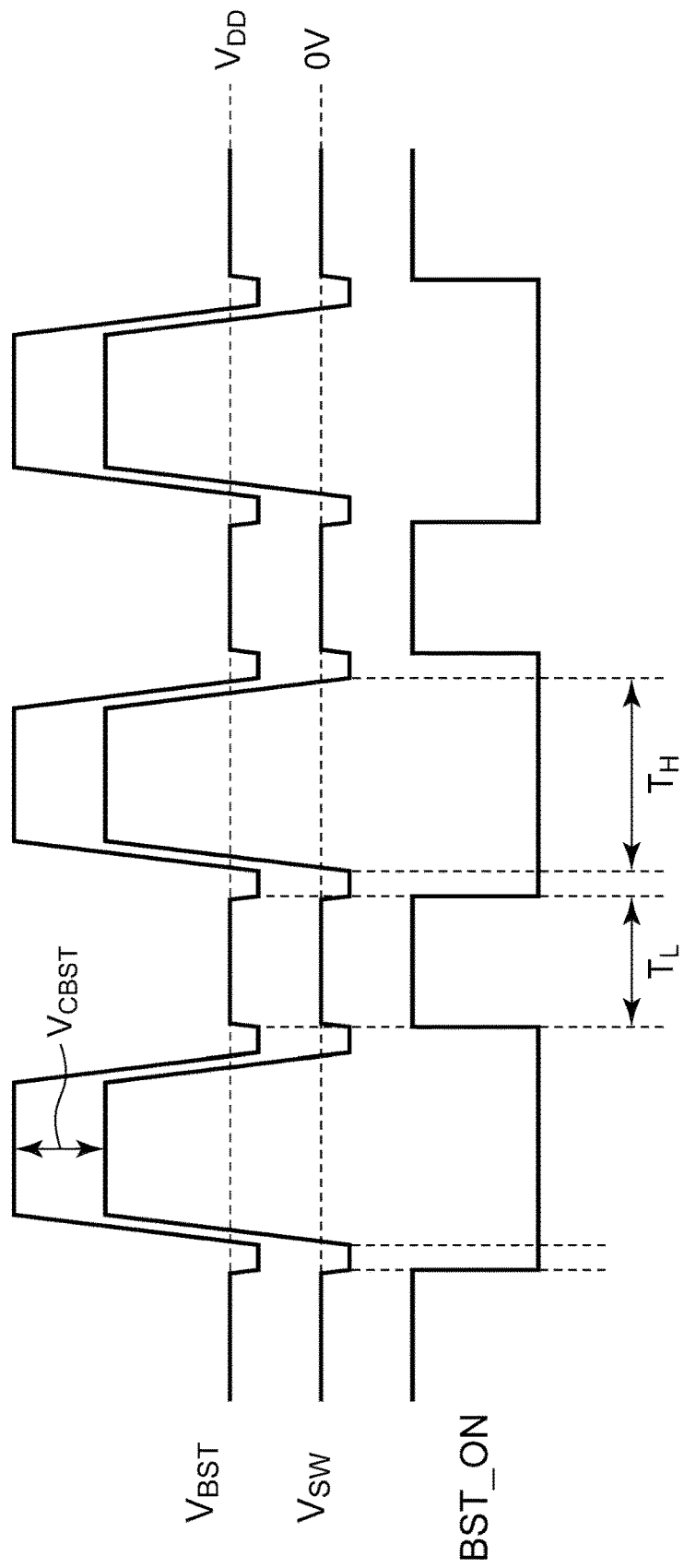
FIG. 7 is an operation waveform chart of the switching circuit illustrated in FIG. 2.

With reference to the first embodiment again, the operation in the first embodiment will be described. FIG. 7 is an operation waveform chart of the switching circuit 200 illustrated in FIG. 2.

During a low interval $T_L$, the bootstrap switch SW1 is on, the voltage of the BST terminal is the power supply voltage $V_{DD}$, and the voltage $V_{SW}$ of the SW terminal is 0 V. Hence, during the low interval $T_L$, the bootstrap capacitor $C_{BST}$ is charged at the power supply voltage $V_{DD}$, and the voltage $V_{CBST}$ of the bootstrap capacitor $C_{BST}$ is $V_{DD}$. This operation is similar to that of the comparative technology illustrated in FIG. 4.

When the low-side transistor M2 is turned off at time to, a transition is made to a dead time $T_D$. As a result, the switching voltage $V_{SW}$ makes a transition from the input voltage $V_{IN}$ to the negative voltage $-V_{NEG}$. At this time, the charge of the bootstrap capacitor $C_{BST}$ is preserved, and therefore, the voltage $V_{BST}$ of the BST terminal decreases to approximately $V_{DD}-V_{NEG}$.

The bootstrap switch SW1 is off in the dead time Td. In the present embodiment, the bootstrap switch SW1 includes the two PMOS transistors connected in anti-series with each other, and no current flows through the body diodes D11 and D12. Hence, the BST terminal maintains high impedance, and the bootstrap capacitor $C_{BST}$ is not charged, so that the voltage $V_{CBST}$ of the bootstrap capacitor $C_{BST}$ is maintained at the original voltage level $V_{DD}$. That is, no overcharge occurs.

When the high-side transistor M1 is turned on at time $t_1$, the switching voltage $V_{SW}$ rises to the input voltage $V_{IN}$. At this time, the voltage $V_{CBST}$ across the bootstrap capacitor $C_{BST}$ maintains the latest voltage level $V_{DD}$, and therefore, the voltage $V_{BST}$ of the BST terminal rises to $V_{SW}+V_{CBST}=V_{IN}+V_{DD}$.

The operation of the switching circuit 200 has been described above. According to the switching circuit 200, the overvoltage which occurs in the comparative technology can be suppressed. The first problem can thus be solved. In addition, the voltage $V_{CBST}$ across the bootstrap capacitor $C_{BST}$ is maintained substantially at the constant level $V_{DD}$. The second problem can thus be solved. Further, according to the configuration of the bootstrap switch SW1 in FIG. 2, there is no path through which a current flows into the semiconductor substrate SUB via the parasitic elements of the first PMOS transistor M11 and the second PMOS transistor M12. Thus, the substrate voltage can be stabilized. The third problem can thus be solved.

Figure 8:
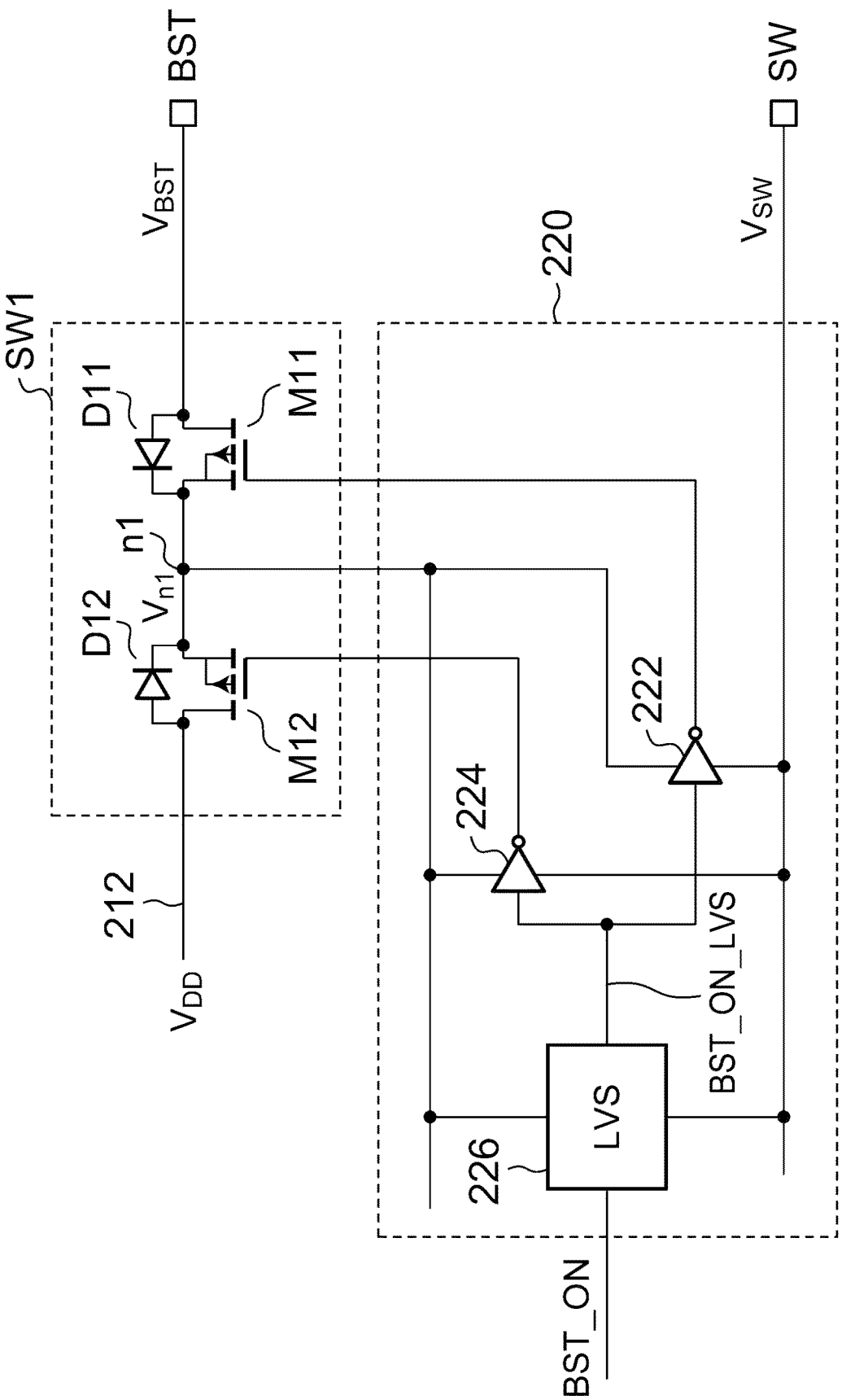
FIG. 8 is a circuit diagram illustrating an example of a configuration of a driver circuit.

FIG. 8 is a circuit diagram illustrating an example of a configuration of the driver circuit 220. The driver circuit 220 includes a first inverter 222, a second inverter 224, and a level shifter 226. In this configuration, a node n1 to which the sources of the first PMOS transistor M11 and the second PMOS transistor M12 are connected in the bootstrap switch SW1 is at a highest potential. Hence, upper-side power supply terminals of the first inverter 222 and the second inverter 224 are connected to the node n1. Lower-side power supply terminals of the first inverter 222 and the second inverter 224 are connected to the SW terminal.

The level shifter 226 level-shifts the high level of the control signal BST_ON to a voltage $V_{n1}$ of the node n1, and level-shifts the low level of the control signal BST_ON to the voltage $V_{SW}$ of the SW terminal.

When the level-shifted control signal BST_ON_LVS is high ($V_{n1}$), the first inverter 222 applies a low voltage ($V_{SW}$) to the gate of the first PMOS transistor M11, and thus, the first PMOS transistor M11 is turned on. Similarly, when the level-shifted control signal BST_ON_LVS is high ($V_{n1}$), the second inverter 224 applies a low voltage ($V_{SW}$) to the gate of the second PMOS transistor M12, and thus, the second PMOS transistor M12 is turned on.

When the level-shifted control signal BST_ON_LVS is low ($V_{SW}$), the first inverter 222 applies a high voltage ($V_{n1}$) to the gate of the first PMOS transistor M11, and thus, the first PMOS transistor M11 is turned off. Similarly, when the level-shifted control signal BST_ON_LVS is low ($V_{SW}$), the second inverter 224 applies a high voltage ($V_{n1}$) to the gate of the second PMOS transistor M12, and thus, the second PMOS transistor M12 is turned off.

According to the driver circuit 220, the bootstrap switch SW1 can be driven reliably.

Figure 9:
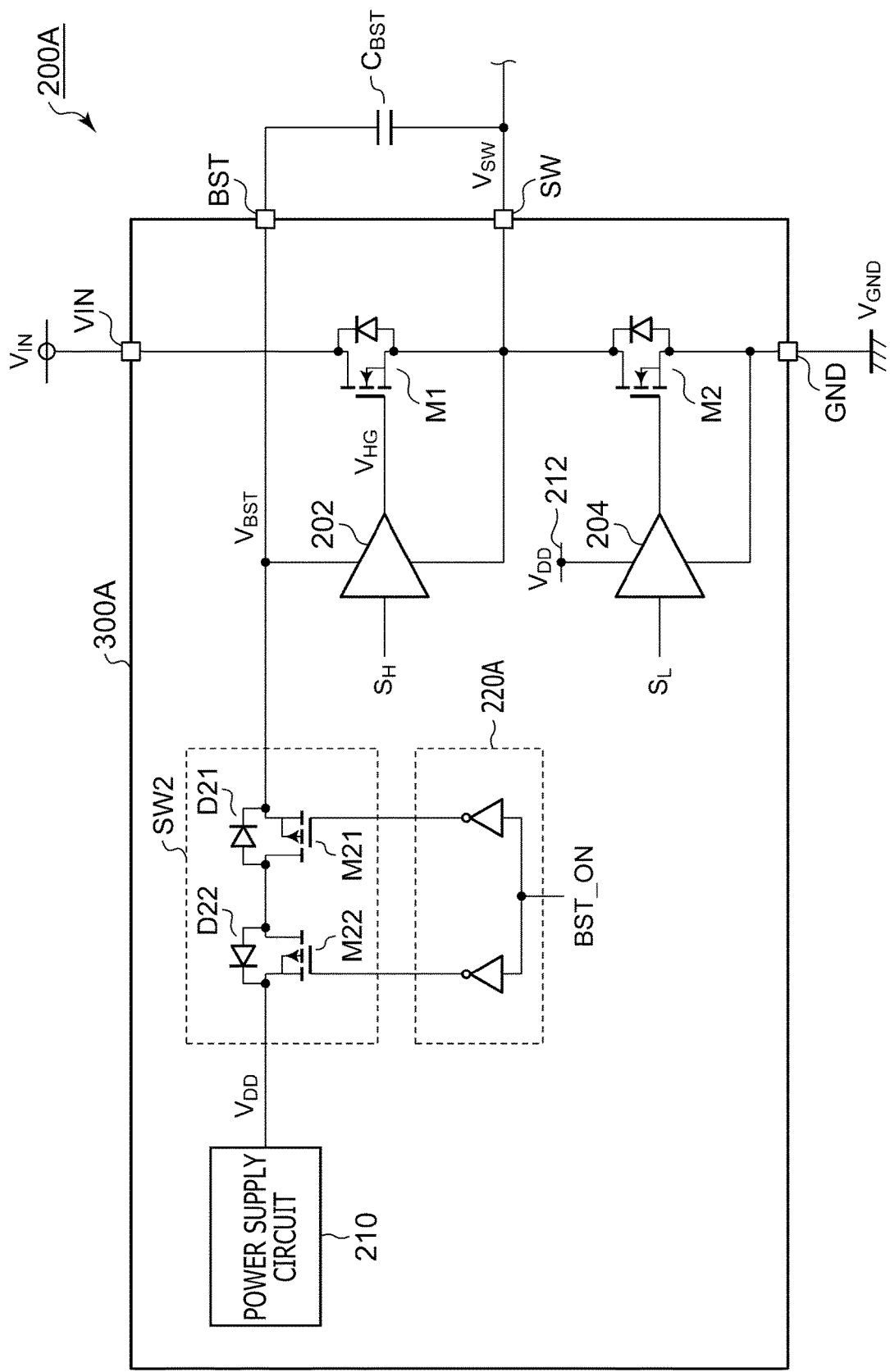
FIG. 9 is a circuit diagram of a switching circuit according to a second embodiment.

FIG. 9 is a circuit diagram of a switching circuit 200A according to a second embodiment. In the second embodiment, a configuration of a bootstrap switch SW2 in a control circuit 300A is different from that of the bootstrap switch SW1 according to the first embodiment (FIG. 2). Specifically, the bootstrap switch SW2 includes a first PMOS transistor M21 and a second PMOS transistor M22. The two PMOS transistors M21 and M22 are arranged such that drains of the respective PMOS transistors M21 and M22 are connected to each other and such that anodes of body diodes D21 and D22 face each other. The other configuration is similar to that of FIG. 2.

According to the switching circuit 200A, it is possible to obtain effects similar to those of the first embodiment and solve the first to third problems.

Figure 10:
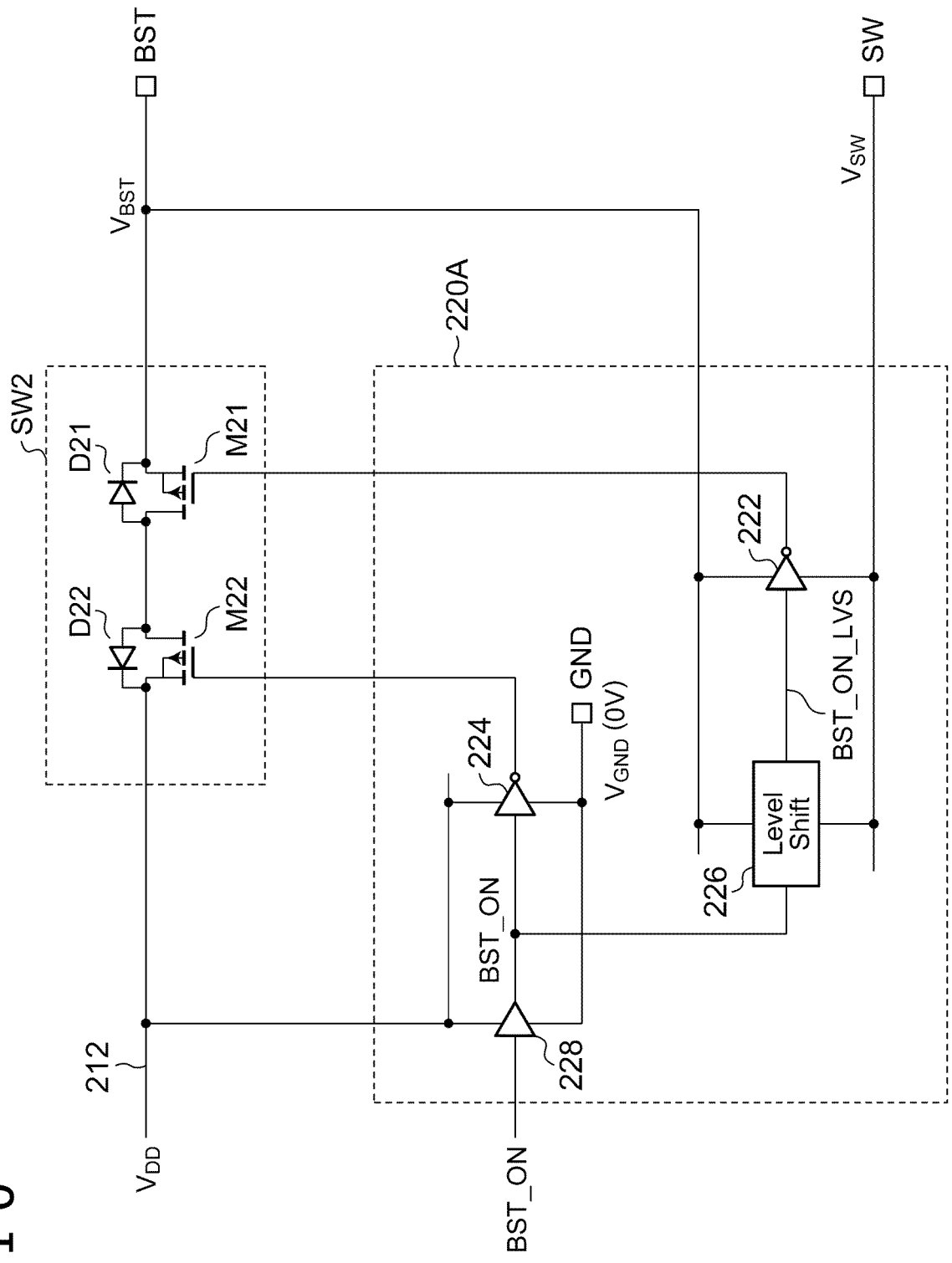
FIG. 10 is a circuit diagram illustrating an example of a configuration of a driver circuit.

FIG. 10 is a circuit diagram illustrating an example of a configuration of a driver circuit 220A. The driver circuit 220A includes a first inverter 222, a second inverter 224, a level shifter 226, and a buffer 228. In this configuration, the BST terminal is at a highest potential for the first PMOS transistor M21, and the power supply voltage $V_{DD}$ is at a highest potential for the second PMOS transistor M22. Thus, the configuration of the driver circuit 220A is different from that of the driver circuit 220 in FIG. 8.

The upper-side power supply terminal of the first inverter 222 is connected to the BST terminal. The lower-side power supply terminal of the first inverter 222 is connected to the SW terminal.

The level shifter 226 level-shifts the high level of the control signal BST_ON to the voltage $V_{BST}$ of the BST terminal, and level-shifts the low level of the control signal BST_ON to the voltage $V_{SW}$ of the SW terminal.

The upper-side power supply terminal of the second inverter 224 is connected to the constant voltage line and is supplied with the power supply voltage $V_{DD}$. The lower-side power supply terminal of the second inverter 224 is grounded.

The buffer 228 may be disposed in a stage preceding the second inverter 224 and the level shifter 226.

When the level-shifted control signal BST_ON_LVS is high ($V_{BST}$), the first inverter 222 applies a low voltage ($V_{SW}$) to the gate of the first PMOS transistor M21, and thus, the first PMOS transistor M21 is turned on.

When the control signal BST_ON is high ($V_{DD}$), the second inverter 224 applies a low voltage (0 V) to the gate of the second PMOS transistor M22, and thus, the second PMOS transistor M22 is turned on.

When the level-shifted control signal BST_ON_LVS is low ($V_{SW}$), the first inverter 222 applies a high voltage ($V_{BST}$) to the gate of the first PMOS transistor M21, and thus, the first PMOS transistor M21 is turned off.

When the control signal BST_ON is low (0 V), the second inverter 224 applies a high voltage ($V_{DD}$) to the gate of the second PMOS transistor M22, and thus, the second PMOS transistor M22 is turned off.

According to the driver circuit 220A in FIG. 10, the bootstrap switch SW2 can be driven reliably.

The switching circuit 200A according to the second embodiment further has the following advantages in comparison with the switching circuit 200 according to the first embodiment. In the first embodiment, there is a possibility that a higher voltage than the power supply voltage $V_{DD}$ may be applied between the drain and the source of each of the first PMOS transistor M11 and the second PMOS transistor M12, and therefore, each of the first PMOS transistor M11 and the second PMOS transistor M12 needs to include a high withstand voltage element.

On the other hand, in the second embodiment, while there is a possibility that a high voltage may be applied as the drain-to-source voltage of the first PMOS transistor M21, no high voltage is applied as the drain-to-source voltage of the second PMOS transistor M22. Hence, it is sufficient if only the first PMOS transistor M21 includes a high withstand voltage element, and the second PMOS transistor M22 can include a low withstand voltage element. It is to be noted that the high withstand voltage element and the low withstand voltage element in this case are in relative terms. In a case where one transistor is to be formed by using the same on-resistance, the size (area) of the high withstand voltage element is several times (for example, twice) the size of the low withstand voltage element.

The sizes will be considered with the comparative technology as a reference. In the comparative technology, the transistor M3 needs to include a high withstand voltage element. Suppose that the size of the transistor M3 is two. In the first embodiment, the bootstrap switch SW1 has the two high withstand voltage elements M11 and M12 connected in series with each other. Thus, in order to make the on-resistance of the bootstrap switch SW1 equal to the on-resistance of the transistor M3 according to the comparative technology, the on-resistance of each of the high withstand voltage elements M11 and M12 needs to be halved. Hence, the size of one high withstand voltage element becomes twice the size of the high withstand voltage element required in the comparative technology, i.e., two. That is, the size of one high withstand voltage element becomes four. Hence, the size of the bootstrap switch SW1 is 4+4=8, which requires an area four times the area of the bootstrap switch SW3 according to the comparative technology.

In the second embodiment, the bootstrap switch SW2 has one high withstand voltage element M21 and one low withstand voltage element M22 connected in series with each other. Hence, in order to make the on-resistance of the bootstrap switch SW2 equal to the on-resistance of the bootstrap switch SW3 according to the comparative technology, the on-resistance of each of the high withstand voltage element M21 and the low withstand voltage element M22 needs to be reduced. Suppose that, in order to reduce the on-resistance, for example, the on-resistance of the transistor M21 is set to 0.414 times the on-resistance of the transistor M3, and the on-resistance of the transistor M22 is set to 0.586 times the on-resistance of the transistor M3. The area of the bootstrap switch SW2 in that case is 2.91 times the area of the bootstrap switch SW3.

Thus, according to the second embodiment, it is also possible to suppress an increase in area as compared with the first embodiment.

Figure 11:
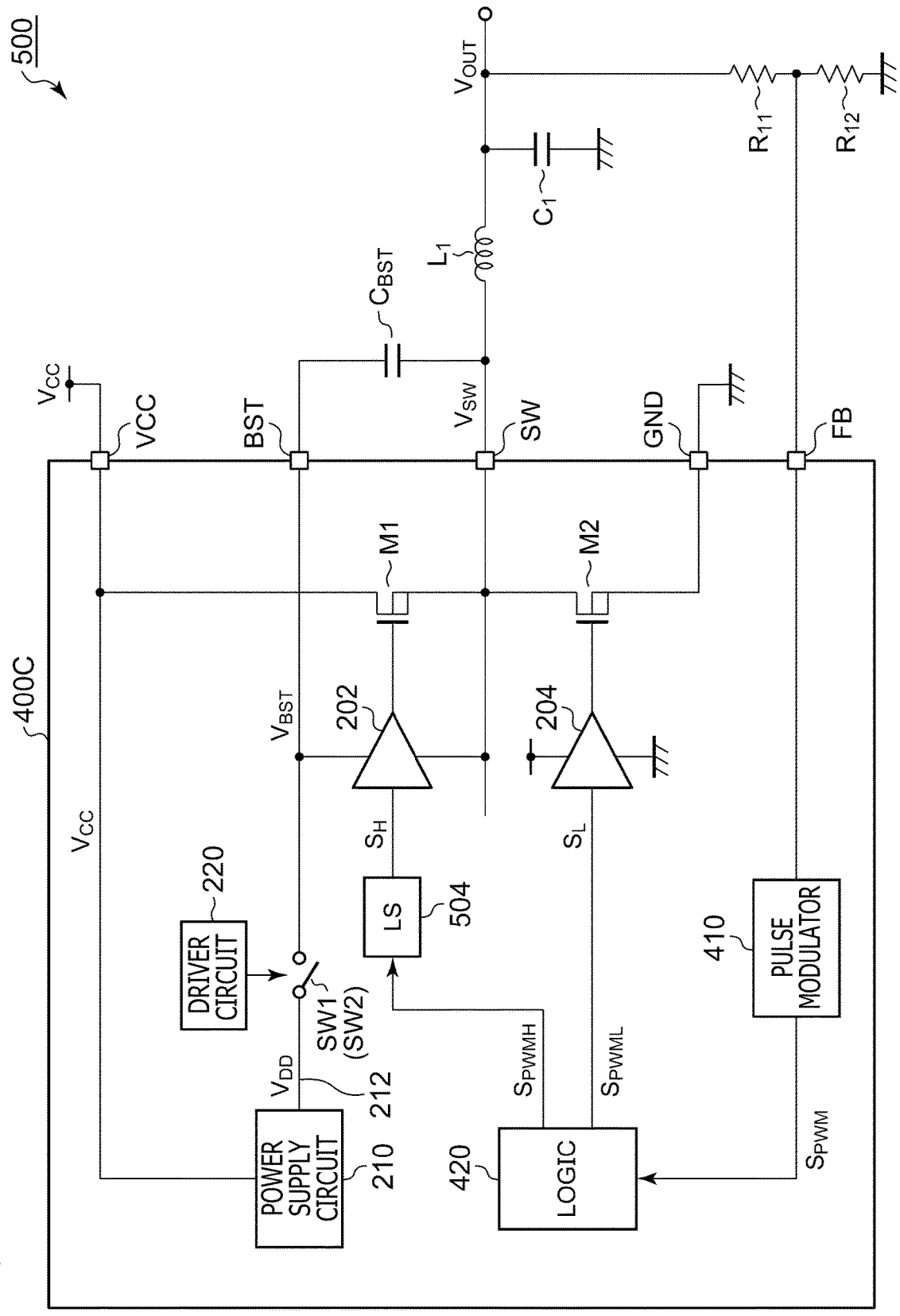
FIG. 11 is a circuit diagram of a DC/DC converter.

Applications of the switching circuit 200 will next be described. The switching circuit 200 can be applied to a DC/DC converter, for example. FIG. 11 is a circuit diagram of a DC/DC converter 500. The DC/DC converter 500 includes a control circuit 300C, a bootstrap capacitor $C_{BST}$, an inductor $L_1$, an output capacitor $C_1$, and resistances $R_{11}$ and $R_{12}$. The control circuit 300C is a functional integrated circuit (IC) that is integrated on one semiconductor substrate.

This DC/DC converter 500 outputs a constant voltage and supplies an output voltage $V_{OUT}$ stabilized at a predetermined level to a load not illustrated. A feedback signal $V_{FB}$ obtained by dividing the output voltage $V_{OUT}$ of the DC/DC converter 500 by the resistances $R_{11}$ and $R_{12}$ is input to a feedback (FB) terminal of the control circuit 300C. In a converter that outputs a constant current, a feedback signal $V_{FB}$ based on an output current is fed back.

A pulse modulator 410 generates a pulse signal $S_{PWM}$ that gives an instruction for turning on or off the high-side transistor M1 such that the feedback signal $V_{FB}$ approaches a target value $V_{REF}$. A logic circuit 420 generates pulse signals $S_{PWMH}$ and $S_{PWML}$ for controlling the high-side transistor M1 and the low-side transistor M2, respectively, according to the pulse signal $S_{PWM}$. The high-side pulse signal $S_{PWMH}$ is converted into a high-side pulse $S_H$ by a level shifter 504. The high-side pulse $S_H$ is supplied to the high-side driver 202. The low-side pulse signal $S_{PWML}$ is supplied as a low-side pulse $S_L$ to the low-side driver 204.

Applications of the switching circuit 200 are not limited to the DC/DC converter, and the switching circuit 200 is applicable to, for example, a power converter such as an inverter or a converter and is also applicable to a motor driver.

The embodiments are illustrative, and it is to be understood by those skilled in the art that various modifications can be made on the combinations of the constituent elements and the processing processes of those embodiments and that such modifications are also included in the scope of the present disclosure or the present technology.

What is claimed is:

1. A switching circuit comprising:
   an input terminal;
   a switching terminal;
   a grounding terminal;
   a bootstrap terminal;
   a high-side transistor connected between the input terminal and the switching terminal;
   a low-side transistor connected between the switching terminal and the grounding terminal;
   a bootstrap capacitor connected between the switching terminal and the bootstrap terminal;
   a bootstrap switch connected between a constant voltage line and the bootstrap terminal; and
   a driver circuit configured to turn on the bootstrap switch in a period of time in which the low-side transistor is on and to turn off the bootstrap switch in a period of time in which the low-side transistor is off, wherein
   the bootstrap switch includes two P-channel metal oxide semiconductor transistors connected in anti-series with each other between the constant voltage line and the bootstrap terminal.

2. The switching circuit according to claim 1, wherein sources of the two P-channel metal oxide semiconductor transistors are connected to each other.

3. The switching circuit according to claim 2, wherein the driver circuit includes
   a level shifter configured to level-shift a control signal that gives an instruction for turning on or off the bootstrap switch,
   a first inverter configured to drive one of the two P-channel metal oxide semiconductor transistors according to output of the level shifter, and
   a second inverter configured to drive the other one of the two P-channel metal oxide semiconductor transistors according to the output of the level shifter,
   the level shifter level-shifts a high level of the control signal to a voltage of the sources of the two P-channel metal oxide semiconductor transistors and level-shifts a low level of the control signal to a voltage of the switching terminal,
   upper-side power supply terminals of the first inverter and the second inverter are connected to the respective sources of the two P-channel metal oxide semiconductor transistors, and
   lower-side power supply terminals of the first inverter and the second inverter are connected to the switching terminal.

4. The switching circuit according to claim 1, wherein drains of the two P-channel metal oxide semiconductor transistors are connected to each other.

5. The switching circuit according to claim 4, wherein the driver circuit includes
   a level shifter configured to level-shift a control signal that gives an instruction for turning on or off the bootstrap switch,
   a first inverter configured to drive a first transistor of the two P-channel metal oxide semiconductor transistors that is on a bootstrap terminal side, according to output of the level shifter, and
   a second inverter configured to drive a second transistor of the two P-channel metal oxide semiconductor transistors that is on a constant voltage line side, according to the control signal,
   the level shifter level-shifts a high level of the control signal to a voltage of the bootstrap terminal and level-shifts a low level of the control signal to a voltage of the switching terminal,
   an upper-side power supply terminal of the first inverter is connected to the bootstrap terminal, and a lower-side power supply terminal of the first inverter is connected to the switching terminal, and
   an upper-side power supply terminal of the second inverter is connected to the constant voltage line, and a lower-side power supply terminal of the second inverter is grounded.

6. The switching circuit according to claim 1, wherein the switching circuit is integrally mounted on one semiconductor substrate.

7. A control circuit of a direct current to direct current converter, the control circuit comprising:
   the switching circuit according to claim 1; and
   a feedback controller configured to perform feedback control on the switching circuit such that a state of the direct current to direct current converter approaches a target state.

8. A converter, comprising:
   a control circuit, wherein the control circuit comprising the switching circuit according to claim 1, and a feedback controller configured to perform feedback control on the switching circuit such that a state of the converter approaches a target state.

* * * * *